United States Patent
Fujii et al.

(10) Patent No.: US 9,698,287 B2
(45) Date of Patent: Jul. 4, 2017

(54) EPITAXIAL WAFER, METHOD FOR PRODUCING THE SAME, SEMICONDUCTOR ELEMENT, AND OPTICAL SENSOR DEVICE

(71) Applicant: Sumitomo Electric Industries, Ltd., Osaka (JP)

(72) Inventors: Kei Fujii, Itami (JP); Kaoru Shibata, Itami (JP); Katsushi Akita, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 187 days.

(21) Appl. No.: 14/260,110

(22) Filed: Apr. 23, 2014

(65) Prior Publication Data

US 2014/0319463 A1  Oct. 30, 2014

(30) Foreign Application Priority Data

Apr. 30, 2013 (JP) .................. 2013-095756

(51) Int. Cl.
*H01L 31/105* (2006.01)
*H01L 31/0352* (2006.01)
(Continued)

(52) U.S. Cl.
CPC .. *H01L 31/035236* (2013.01); *H01L 21/0243* (2013.01); *H01L 21/0262* (2013.01);
(Continued)

(58) Field of Classification Search
CPC ..... H01L 31/035281; H01L 31/035236; H01L 31/184; H01L 31/0304; H01L 31/02363;
(Continued)

(56) References Cited

U.S. PATENT DOCUMENTS 5,647,917 A * 7/1997 Oida ...................... C30B 23/02
117/101
5,886,360 A 3/1999 Ochi
(Continued)

FOREIGN PATENT DOCUMENTS

CN 102265138 A 11/2011
CN 102782809 A 11/2012
(Continued)

OTHER PUBLICATIONS

J. Hu et al., "Type II Photoluminescence and Conduction Band Offsets of GaAsSb/InGaAs and GaAsSb/InP Heterostructures Grown by Metalorganic Vapor Phase Epitaxy," Applied Physics Letters, vol. 73, No. 19, pp. 2799-2801 (1998).
(Continued)

*Primary Examiner* — David Vu
*Assistant Examiner* — Mouloucoulaye Inoussa
(74) *Attorney, Agent, or Firm* — Venable LLP; Michael A. Sartori; F. Brock Riggs (57) ABSTRACT

An epitaxial wafer of the present invention includes a substrate composed of a III-V compound semiconductor, a multiple quantum well structure composed of a III-V compound semiconductor and located on the substrate, and a top layer composed of a III-V compound semiconductor and located on the multiple quantum well structure. The substrate has a plane orientation of (100) and an off angle of −0.030° or more and +0.030° or less, and a surface of the top layer has a root-mean-square roughness of less than 10 nm.

11 Claims, 8 Drawing Sheets (51) Int. Cl.
*H01L 31/0304* (2006.01)
*H01L 31/18* (2006.01)
*H01L 21/02* (2006.01)

(52) U.S. Cl.
CPC .. *H01L 21/02389* (2013.01); *H01L 21/02433* (2013.01); *H01L 21/02458* (2013.01); *H01L 21/02463* (2013.01); *H01L 21/02466* (2013.01); *H01L 21/02507* (2013.01); *H01L 21/02543* (2013.01); *H01L 21/02587* (2013.01); *H01L 31/03046* (2013.01); *H01L 31/105* (2013.01); *H01L 31/1844* (2013.01); *Y02E 10/544* (2013.01); *Y02P 70/521* (2015.11)

(58) Field of Classification Search
CPC .............. H01L 31/105; H01L 31/1844; H01L 31/03046
USPC ................ 257/21, 347; 438/87, 71, 478, 94; 977/759, 954
See application file for complete search history.

(56) References Cited

U.S. PATENT DOCUMENTS

| | | | |
|---|---|---|---|
| 8,236,599 | B2 | 8/2012 | Chang et al. |
| 2011/0210313 | A1* | 9/2011 | Fujii .................. B82Y 20/00 257/21 |
| 2012/0032147 | A1* | 2/2012 | Nagai ................ A61B 5/14532 257/21 |
| 2012/0326122 | A1 | 12/2012 | Fujii et al. |
| 2013/0099203 | A1* | 4/2013 | Akita .................. B82Y 20/00 257/21 |
| 2014/0054545 | A1* | 2/2014 | Akita ............. H01L 31/035236 257/21 |

FOREIGN PATENT DOCUMENTS

| | | |
|---|---|---|
| JP | 2000-208806 A | 7/2000 |
| JP | 2004-207588 A | 7/2004 |
| JP | 2008-270760 A | 11/2008 |
| JP | 2009-206499 A | 9/2009 |
| JP | 2011-060853 A | 3/2011 |
| JP | 2011-204919 A | 10/2011 |
| WO | WO-2009/014076 A1 | 1/2009 |
| WO | WO-2011/016309 A1 | 2/2011 |
| WO | WO-2011/090040 A1 | 7/2011 |
| WO | WO-2012/114849 A1 | 8/2012 |

OTHER PUBLICATIONS

R. Sidhu et al., "A Long-Wavelength Photodiode on InP Using Lattice-Matched GaInAs-GaAsSb Type-II Quantum Wells," IEEE Photonics Technology Letters, vol. 17, No. 12, pp. 2715-2717 (2005).
R. Sidhu et al., "A 2.3μm Cutoff Wavelength Photodiode on InP Using Lattice-Matched GaInAs-GaAsSb Type-II Quantum Wells," 2005 International Conference on Indium Phosphide and Related Materials, pp. 148-151 (2005).
Notification of Reasons for Rejection in Japanese Patent Application No. 2013-095756 dated Sep. 5, 2016.
Notification of the First Office Action in counterpart Chinese Patent Application No. 201410183366.7, dated Sep. 30, 2016.

* cited by examiner

| TEST SPECIMEN NO. | OFF ANGLE (°) WITH RESPECT TO (100) PLANE OF InP SUBSTRATE | SURFACE MORPHOLOGY | RMS (nm) | DARK CURRENT IN PHOTODIODE |
|---|---|---|---|---|
| A1 | 0.005 |  50μm | 2.4 | RANK A |
| A2 | 0.020 |  50μm | 5.3 | RANK A |
| A3 | 0.033 | SURFACE ROUGHENING  50μm | 13 | RANK C |
| A4 | 0.046 | SURFACE ROUGHENING  50μm | 15 | RANK C |

EPITAXIAL WAFER, METHOD FOR PRODUCING THE SAME, SEMICONDUCTOR ELEMENT, AND OPTICAL SENSOR DEVICE

BACKGROUND OF THE INVENTION

1. Field of the Invention

The present invention relates to an epitaxial wafer, a method for producing the epitaxial wafer, a semiconductor element, and an optical sensor device. More specifically, the present invention relates to an epitaxial wafer including a multiple quantum well (MQW) structure which is composed of a III-V compound semiconductor and whose bandgap energy corresponds to a near infrared region to a far infrared region, a method for producing the epitaxial wafer, a semiconductor element, and an optical sensor device.

2. Description of the Related Art

InP-based semiconductors, which are composed of III-V compounds, have a bandgap energy corresponding to a near infrared region to an infrared region and hence a large number of studies are conducted to develop photodiodes for communications, image capturing at night, and the like. For example, J. Hu, et. al. "Type II photoluminescence and conduction band offsets of GaAsSb/InGaAs and GaAsSb/InP heterostructures grown by metalorganic vapor phase epitaxy", APPLIED PHYSICS LETTERS, Vol. 73, No. 19 (1998), pp. 2799-2801 discloses an experiment in which each of InGaAs/GaAsSb type-II MQWs including InGaAs layers with different thicknesses is formed on an InP substrate and the resulting change in the bandgap energy is detected using a photoluminescence emission spectrum. R. Sidhu, et. al. "A Long-Wavelength Photodiode on InP Using Lattice-Matched GaInAs—GaAsSb Type-II Quantum Wells", IEEE Photonics Technology Letters, Vol. 17, No. 12 (2005), pp. 2715-2717 discloses a photodiode in which an InGaAs/GaAsSb type-II MQW is formed on an InP substrate and a p-n junction is formed by performing doping during the growth of an epitaxial layer, the photodiode having characteristic sensitivity in a wavelength range of 1.7 µm to 2.7 µm. R. Sidhu, et. al. "A 2.3 µm Cutoff Wavelength Photodiode on InP Using Lattice-Matched GaInAs—GaAsSb Type-II Quantum Wells", 2005 International Conference on Indium Phosphide and Related Materials, pp. 148-151 discloses a photodiode including a type-II MQW absorption layer having 150 pairs layered such that 5 nm InGaAs and 5 nm GaAsSb constitute a single pair, the photodiode having characteristic sensitivity (200 K, 250 K, and 295 K) in a wavelength range of 1 µm to 3 µm.

In addition, Japanese Unexamined Patent Application Publication No. 2011-60853 proposes the following technique: in a photodiode that includes an absorption layer containing antimony (Sb) as a group V element and an InP window layer, a donor impurity is incorporated into the InP window layer and, as a result, incorporation of antimony into the InP window layer causing conversion into a p-type window layer is canceled out to thereby decrease the dark current.

The above-described photodiodes are each disposed on an InP (100) substrate. The surface of the InP (100) substrate is subjected to a typical treatment such as wet etching as a matter of course, but the surface morphology of the InP (100) substrate is not further controlled. However, when a thick epitaxial layered body is formed on a substrate like a photodiode, the surface morphology of an epitaxial layered body after deposition is highly dependent on the surface form of the substrate at the beginning of the deposition. Consequently, the crystallinity of the epitaxial layered body varies in accordance with the surface morphology. That is, when the surface morphology of a top layer of the epitaxial layered body is poor, the crystallinity of a layered body is also poor.

SUMMARY OF THE INVENTION

Accordingly, it is an object of the present invention to provide an epitaxial wafer in which good crystallinity of an epitaxial layered body and good surface morphology obtained as a result of the good crystallinity can be achieved by precisely controlling the off angle and the like of a semiconductor substrate, a method for producing the epitaxial wafer, a semiconductor element, and an optical sensor device.

An epitaxial wafer according to an embodiment of the present invention includes a substrate composed of a III-V compound semiconductor, a multiple quantum well structure composed of a III-V compound semiconductor and located on the substrate, and a top layer composed of a III-V compound semiconductor and located on the multiple quantum well structure. The substrate has a plane orientation of (100) and an off angle of −0.030° or more and +0.030° or less, and a surface of the top layer has a root-mean-square (RMS) roughness of less than 10 nm.

According to the present invention, by precisely controlling the off angle of a semiconductor substrate at the beginning of the growth of an epitaxial layer, good surface morphology is achieved after the deposition of an epitaxial layered body and an epitaxial layer having good crystallinity can be provided.

DESCRIPTION OF THE PREFERRED EMBODIMENTS

First, embodiments of the present invention will be described.

1. Epitaxial Wafer (1) An epitaxial wafer according to an embodiment of the present invention includes a substrate composed of a III-V compound semiconductor, a multiple quantum well structure composed of a III-V compound semiconductor and located on the substrate, and a top layer composed of a III-V compound semiconductor and located on the multiple quantum well structure. The substrate has a plane orientation of (100) and an off angle of −0.030° or more and +0.030° or less. The top layer has a surface with a root-mean-square (RMS) roughness of less than 10 nm. In the production of a semiconductor element composed of a III-V compound semiconductor, a substrate having an off angle of 0.05° to 0.1° (absolute value) with respect to a (100) plane is generally used. In other words, the off angle of −0.030° or more and +0.030° or less with respect to a (100) plane in this embodiment is much smaller than the off angle generally employed. The substrate having such a small off angle may be called a just-angle substrate. A large off angle is generally employed as described above because, when an off angle is large, other layers are easily epitaxially grown from the viewpoint of thermodynamics in consideration of the surface energy of the off angle or the like. However, if an importance is not given to the growth rate or the like in epitaxial growth, the off angle is preferably small in terms of crystallinity as in this embodiment. From the actual results, if the absolute value of an off angle with respect to a (100) plane is more than 0.030°, good crystallinity cannot be achieved in each epitaxial layer because the square-root-mean (RMS) roughness of a surface of the top layer increases to 10 nm or more. It is also difficult to form projections or depressions on the surface of the top layer described below at an appropriate density. Based on such results, the absolute value of the off angle with respect to a (100) plane is 0.030° or less in this embodiment. When the off angle satisfies the above range, the direction of the off angle may be any direction. Note that the off angle can be measured with, for example, a commercially available X-ray wafer plane orientation measurement instrument.

(2) RMS Value of Surface of Top Layer (i) The RMS value of the surface of the top layer is less than 10 nm because the RMS value of the surface indicates the inside crystallinity. In fact, the dark current is suppressed to a low level when a photodiode is produced using an epitaxial wafer having an RMS value of less than 10 nm whereas the dark current increases to an unfavorable level when the RMS value is 10 nm or more. The RMS value is more preferably 7.5 nm or less.

(ii) The RMS value may be measured by any instrument. For example, a commercially available atomic force microscope (AFM) is employed and the RMS measurement can be selected to obtain data (average value). In this measurement, the measurement range (length and width, area, or the like) is not particularly limited and any range may be employed. For example, an average RMS value may be determined in a measurement range such as a square region having 10 μM sides or a square region having 100 μm sides.

(3) Projections or Depressions on Surface of Top Layer

Each of the projections or depressions has a diameter of about 30 μm or less and normally has a diameter of about 10 to 20 μm. The height or depth is not measured in detail but is several micrometers or less, which is minute. If the projections or depressions appear to the extent described below, there are no problems and, on the contrary, crystallinity at a practical level is guaranteed. In general, the crystallinity of an epitaxial layer is thought to be degraded due to surface defects such as surface roughening and projections and depressions. However, according to the studies conducted by the inventors of the present invention, the inside crystallinity does not degrade as long as the projections or depressions are formed within a certain level. In other words, if the projections or depressions are formed within a certain level, the dark current remains low when the epitaxial wafer is used for a photodiode and the emission intensity does not decrease when the epitaxial wafer is used for a light emitting element. In the case where the epitaxial wafer is used for a light emitting element, a surface pattern of projections or depressions is formed and thus light emitted from an active layer is not easily subjected to total reflection at the surface of a contact layer and is easily emitted to the outside from the surface of an epitaxial layered body or the contact layer. That is, light is easily extracted and the emission intensity can be improved.

Such projections or depressions can be formed with high reproducibility by performing typical metal-organic vapor phase epitaxy (MOVPE) at a relatively low growth temperature and increasing the decomposition efficiency of source gases. The number of pairs in a multiple quantum well structure certainly affects the formation of projections or depressions. When the number of pairs is 25 or more, the projections or depressions are formed. As the number of pairs increases, the formation of projections or depressions becomes more significant. The reason for the reproducibility regarding the formation of projections or depressions is unclear, but the reproducibility seems to be 100% as long as the requirements of the number of pairs and the growth temperature are satisfied. When the number of projections or depressions per unit area exceeds $10^6/cm^2$, the projections or depressions are densely formed so as to cover the entire surface. This makes it difficult to individually count the projections or depressions. If the projections or depressions cover the entire surface in such a manner, the inside crystallinity also degrades and the dark current considerably increases when the epitaxial wafer is used for a photodiode. This is expressed as "the surface morphology degrades" or "the surface roughening occurs". When the number of projections or depressions per unit area is $10^6/cm^2$ or less, the projections or depressions can be counted and the inside crystallinity is at a practical level as described above.

The phrase "projections or depressions" is a phrase (expression) that describes the surface morphology. This phrase is not intended to differentiate between projections and depressions. For example, the phrase "projections or depressions" does not mean that projections are formed in some cases and depressions are formed in other cases. The phrase "projections or depressions" describes the surface morphology that is easily and entirely recognized as "projections or depressions" by observing a surface with a scanning electron microscope. For example, the phrase "projections or depressions" may be interpreted as having the following meaning: when projections are formed densely to some extent, portions adjacent to the projections look like depressions. The planar shape of each of the projections or depressions is often a circular shape, but is sometimes an elongated rectangular shape or an elliptic shape. In such a case, "the length between short sides" or "the minor axis length" is regarded as a diameter. The lower limit of the diameter is about 5 μm or more.

(4) Multiple Quantum Well Structure

The multiple quantum well structure may be a type-II multiple quantum well structure constituted by pairs of $In_xGa_{1-x}As$ ($0.38 \leq x \leq 0.68$) and $GaAs_{1-y}Sb_y$ ($0.36 \leq y \leq 0.62$) or pairs of $Ga_{1-u}In_uN_vAs_{1-v}$ ($0.4 \leq u \leq 0.8$, $0 < v \leq 0.2$) and $GaAs_{1-y}Sb_y$ ($0.36 \leq y \leq 0.62$). In the case of a photodiode, light having a wavelength of 2 to 10 μm, which corresponds to a near infrared region to an infrared region, can be absorbed with high sensitivity and at low dark current. In the case of a light emitting element, a light emitting element that emits light having the above wavelength can be provided.

(5) InP Top Layer

In the case of a light emitting element, at least an InP layer having a wide bandgap is disposed as a top layer and a bottom layer having a wide bandgap is also disposed on the bottom side, whereby the multiple quantum well structure can be sandwiched between the top layer and the bottom layer. This prevents the leakage of carriers and can facilitate the light emission of light emitting diodes (LEDs) or the like. In the case of a photodiode, many techniques of disposing, for example, an electrode or an insulating film to form pixels are accumulated and there are many data concerning, for example, selective diffusion in a planar photodiode. Therefore, photodiodes and light emitting elements can be stably produced with high yield.

(6) Planar Photodiode

When the epitaxial wafer according to an embodiment of the present invention is used for the production of planar photodiodes, a diffusive-concentration-distribution-adjusting layer is preferably disposed between the multiple quantum well structure and the top layer. In the case where an impurity such as zinc (Zn) serving as a p-type impurity is introduced from the top layer by selective diffusion in order to form a p-n junction in the multiple quantum well structure, if an excessively high concentration of Zn is introduced into the multiple quantum well structure, the crystallinity of the multiple quantum well structure degrades. Therefore, the diffusive-concentration-distribution-adjusting layer is disposed directly below the top layer (window layer) and between the top layer and the multiple quantum well structure. Furthermore, a transition region in which a high-concentration portion that extends from the top layer through which the selective diffusion is caused is steeply changed into a low-concentration portion that is located on the multiple quantum well structure side is disposed in the diffusive-concentration-distribution-adjusting layer. The diffusive-concentration-distribution-adjusting layer is preferably composed of InGaAs or the like having a bandgap narrower than that of InP. However, the diffusive-concentration-distribution-adjusting layer is not necessarily disposed.

(7) Semiconductor Element that Uses Epitaxial Wafer

The above-described epitaxial wafer may be used for any semiconductor element. Such a semiconductor element obviously includes the substrate, the multiple quantum well structure, and the top layer included in the epitaxial wafer. The semiconductor element can be used as the above-described light emitting element such as an LED or the above-described photodiode. When the semiconductor element is used as the photodiode, an optical sensor device including the photodiode and a readout circuit in a combined manner is also applicable.

2. Method for Producing Epitaxial Wafer

A method for producing an epitaxial wafer according to an embodiment of the present invention includes a step of growing a multiple quantum well structure composed of a III-V compound semiconductor on a substrate composed of a III-V compound semiconductor and a step of forming a top layer composed of a III-V compound semiconductor on the multiple quantum well structure. The substrate has a plane orientation of (100) and an off angle of $-0.030°$ or more and $+0.030°$ or less. In the step of growing a multiple quantum well structure, the multiple quantum well structure is grown at a growth temperature of 400° C. or higher and 500° C. or lower by metal-organic vapor phase epitaxy (MOVPE). Projections or depressions are formed on a surface of the top layer at a number density of $100/cm^2$ or more and $1 \times 10^6/cm^2$ or less, and the surface of the top layer has an RMS value of less than 10 nm. Thus, as described above, an epitaxial layered body containing a multiple quantum well structure and having good crystallinity can be formed with high reproducibility. Herein, the growth temperature is a substrate surface temperature which is monitored with a pyrometer including an infrared camera and an infrared spectrometer. Therefore, the growth temperature is a substrate surface temperature, to be more precise, it is the surface temperature of the epitaxial layer formed on the substrate. Each of the substrate temperature, growth temperature, and deposition temperature named in a different manner indicates the monitored temperature.

[Details of Embodiments of the Present Invention]

Specific examples of the epitaxial wafer and the like according to an embodiment of the present invention will now be described with reference to the attached drawings. The present invention is not limited to these examples. The scope of the present invention is indicated by claims and embraces all the modifications within the meaning and scope of equivalency of the claims.

Figure 1:
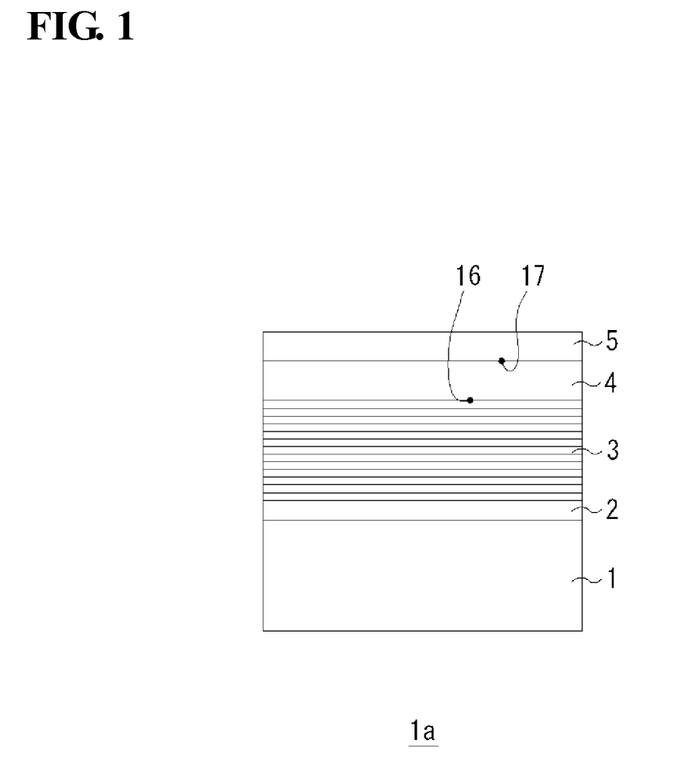
FIG. 1 illustrates an epitaxial wafer according to an embodiment of the present invention.

FIG. 1 is a sectional view illustrating an epitaxial wafer 1a according to an embodiment of the present invention. Referring to FIG. 1, the epitaxial wafer 1a includes the following epitaxial layered body composed of a III-V compound semiconductor and located on an InP substrate 1: n-type InGaAs buffer layer 2/absorption layer 3 including InGaAs/GaAsSb type-II MQW/InGaAs diffusive-concentration-distribution-adjusting layer 4/p-type InP window layer 5.

The composition of the type-II MQW constituted by pairs of InGaAs/GaAsSb is, for example, $In_{0.59}Ga_{0.41}As$ and $GaAs_{0.57}Sb_{0.43}$, but can be changed in accordance with the intended wavelength range. The combination of the thicknesses is not particularly limited, but each layer can suitably have a thickness of 2 to 6 nm. For example, the thicknesses of InGaAs/GaAsSb may be 5 nm/5 nm. In the case of the absorption layer 3 including a type-II MQW, light is absorbed due to the transition of electrons at each interface of the MQW, and therefore the number of interfaces, that is, the number of pairs needs to be increased. The number of pairs is 150 or more, such as 250.

Figure 2:
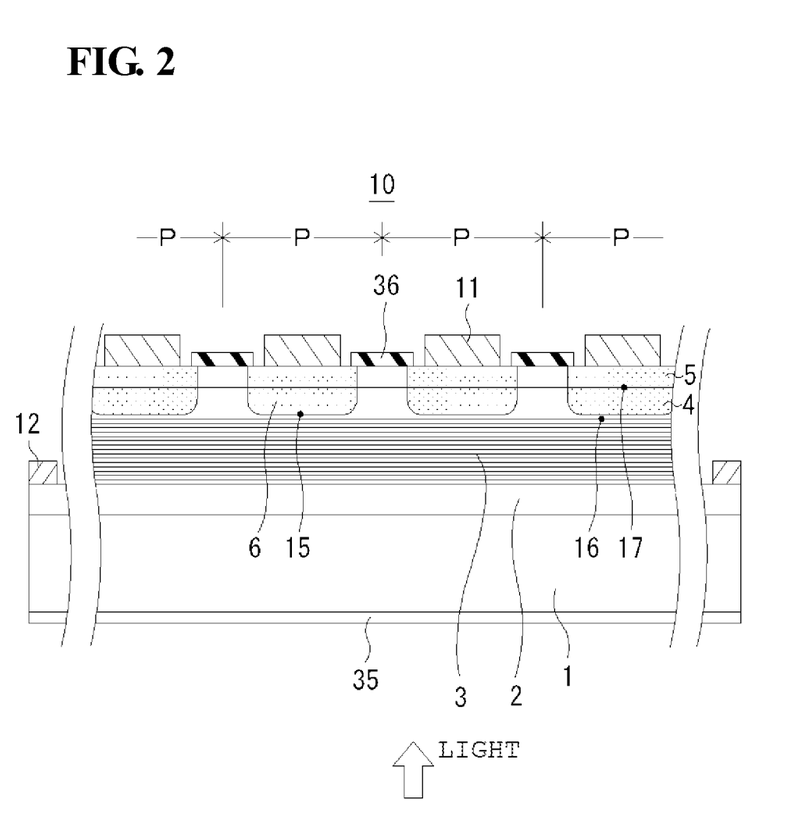
FIG. 2 is a sectional view of a photodiode produced using the epitaxial wafer illustrated in FIG. 1.

FIG. 2 is a sectional view illustrating a photodiode 10 formed using the epitaxial wafer 1a illustrated in FIG. 1. As illustrated in FIG. 2, the photodiode 10 has the following structure: InP substrate 1/InP buffer layer 2/absorption layer 3 including $In_{0.59}Ga_{0.41}As/GaAs_{0.57}Sb_{0.43}$ MQW/InGaAs diffusive-concentration-distribution-adjusting layer 4/InP window layer 5.

The photodiode 10 is a planar photodiode in which adjacent pixels P are isolated from each other by regions into which an impurity is not diffused. However, the epitaxial wafer 1a according to this embodiment may be used in the form of a mesa-type structure in which pixels are physically divided by grooves. In the planar photodiode, a p-type region 6 extends from the InP window layer 5 to the diffusive-concentration-distribution-adjusting layer 4. Such p-type regions 6 are formed by selective diffusion of Zn serving as a p-type impurity through openings of a selective diffusion mask pattern 36 of a SiN film. The adjacent p-type regions 6 are isolated from each other by regions that are not subjected to the selective diffusion. As a result, the pixels P can each independently output absorption data.

In the p-type regions 6, p-electrodes 11 composed of AuZn are disposed so as to form ohmic contacts with the p-type regions 6. On exposed end portions of the surface of the buffer layer 2, which is disposed so as to be in contact with the InP substrate 1, n-electrodes 12 composed of AuGeNi are disposed so as to form ohmic contacts with the exposed end portions. The buffer layer 2 is doped with an n-type impurity so as to have a predetermined level of conductivity. In this case, the InP substrate 1 may be an n-type conductive substrate or a semi-insulating substrate such as an iron (Fe)-doped InP substrate. The substrate 1 included in the photodiode 10 illustrated in FIG. 2 is an iron (Fe)-doped InP substrate. Light enters the InP substrate 1 through the back surface thereof. In order to suppress reflection of incident light, an anti-reflection (AR) film 35 composed of SiON or the like covers the back surface of the InP substrate 1.

A p-n junction 15 is formed at a position corresponding to the boundary front of the p-type region 6. By applying a reverse bias voltage between the p-electrode 11 and the n-electrode 12, in the absorption layer 3, a depletion layer is formed in a larger area on a side in which the concentration of the n-type impurity is lower (n-type impurity background side). The background impurity concentration in the absorption layer 3 having a type-II multiple quantum well structure is, in terms of n-type impurity concentration (carrier concentration), about $1 \times 10^{16}$ cm$^{-3}$ or less. The position of the p-n junction 15 is determined from the point of intersection of the concentration profile of p-type impurity Zn and the background impurity concentration (n-type carrier concentration) in the absorption layer 3 including a multiple quantum well. In the InGaAs diffusive-concentration-distribution-adjusting layer 4, the concentration of the p-type impurity selectively diffused through the surface of the InP window layer 5 sharply drops from the high-concentration region having a concentration of about $1 \times 10^{18}$ cm$^{-3}$ to about $5 \times 10^{18}$ cm$^{-3}$ on the InP window layer 5 side to the MQW 3 side. Accordingly, near the entry portion into the MQW 3, a Zn concentration of $5 \times 10^{16}$ cm$^{-3}$ or less can be easily achieved. As described above, the diffusive-concentration-distribution-adjusting layer 4 is disposed in order to adjust the impurity concentration so that a high-concentration impurity does not enter the multiple quantum well structure 3 while forming the p-n junction 15 in the type-II multiple quantum well structure 3 whose crystallinity prone to degrade in accordance with the impurity concentration. However, the diffusive-concentration-distribution-adjusting layer 4 is not necessarily disposed.

A photodiode 10 according to the present invention is intended to have sensitivity from the near-infrared region to the longer wavelength region. Accordingly, the window layer 5 is formed of a material having a bandgap energy larger than the bandgap energy of the absorption layer 3. For this reason, the window layer is generally formed of InP, which is a material that has a larger bandgap energy than the absorption layer and is highly lattice-matched. Alternatively, InAlAs, which has substantially the same bandgap energy as InP, may be used. The InGaAs diffusive-concentration-distribution-adjusting layer 4 has a bandgap energy smaller than that of InP but has a Zn diffusion rate lower than that in InP. Therefore, the InGaAs diffusive-concentration-distribution-adjusting layer 4 is suitable for adjusting the Zn impurity concentration.

Next, the surface morphology (e.g., RMS and surface roughening) of the epitaxial wafer will be described. Hereinafter, the surface morphology, such as RMS or surface roughening, of the epitaxial wafer 1a before the photodiode 10 is produced will be described.

Figure 3:
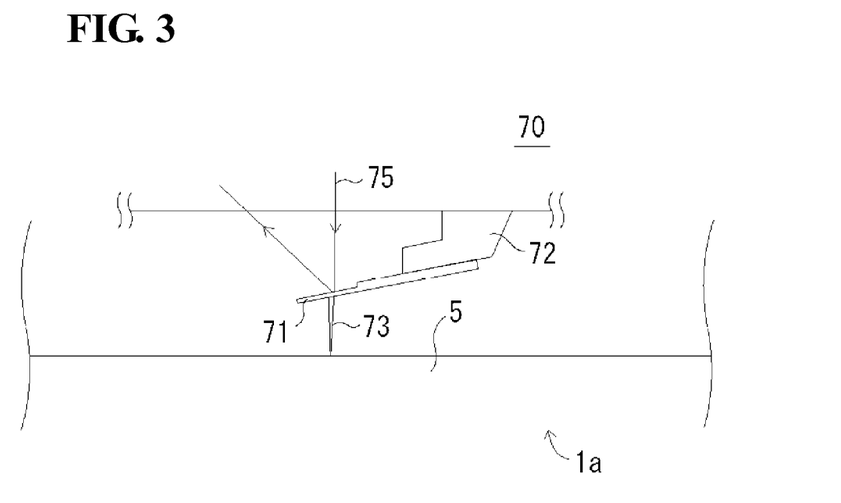
FIG. 3 illustrates an atomic force microscope (AFM) for measuring an RMS value of a surface.

Points in this Embodiment (1) RMS Value of Surface of InP Window Layer 5 of Epitaxial Wafer 1a is Less than 10 Nm The measurement may be performed with an atomic force microscope (AFM) or the like. FIG. 3 is a schematic view illustrating the surface of the epitaxial wafer 1a in FIG. 1, the surface being measured with an atomic force microscope (AFM) 70. In the AFM 70, a probe 73 is attached to the tip of a cantilever 71 which is held by a cantilever holder 72, and the tilt of the cantilever 71 is sharply changed in accordance with irregularities of the sample surface. This change in the tilt of the cantilever 71 is detected with a laser beam 75 to thereby obtain data of the sample surface in terms of irregularities on the nanometer order. The irregularities of the sample surface, which is the surface of the InP window layer 5, are measured, calculated as an RMS value, and automatically displayed on the instrument. This RMS value needs to be less than 10 nm in the present invention. The RMS value, not projections or depressions described below, sharply reflects the inside crystallinity. In reality, when the number of projections or depressions per unit area is in the range of 100/cm$^2$ or more and $1 \times 10^6$/cm$^2$ or less, the RMS value is less than 10 nm. As a result, good crystallinity is achieved and a low dark current is maintained.

(2) Plane Orientation of InP Substrate

The orientation of the substrate is important. The InP substrate 1 needs to have a plane orientation of (100) and an off angle of −0.030° or more and +0.030° or less. Conventionally, an off-angle substrate having an off angle of 0.05° to 0.1° with respect to the (100) plane has been used as a substrate composed of a III-V compound semiconductor. This is because, in consideration of, for example, off-angle surface energy and unavoidable surface defects, an epitaxial layer is easily grown on a large-off-angle surface from the viewpoint of thermodynamics. However, if an importance is not given to growing an epitaxial layer while maintaining a high growth rate, such a large off angle should not be used because a large off angle is a factor of degrading the crystallinity. In this embodiment, an off-angle substrate having a large off angle is not used, but a substrate having a plane orientation of (100) and an off angle of −0.030° or more and +0.030° or less is used. Use of a substrate having an extremely small off angle easily achieves an RMS value of less than 10 nm on the surface of the InP window layer 5. As a result, an epitaxial layered body having good crystallinity is easily obtained.

(3) Projections or Depressions on Surface

Under certain conditions, projections or depressions having a diameter of 30 μm or less are formed on the surface of the InP window layer 5 serving as the top layer of the epitaxial layered body. When the number of the projections or depressions per unit area is in the range of 100/cm$^2$ or more and $1\times10^6/cm^2$ or less, good crystallinity of each layer of the epitaxial layered body, such as a type-II MQW, is achieved. Moreover, this seems to prove that each layer of the epitaxial layered body has good crystallinity. The conditions under which such projections or depressions are formed have been found for the first time by repeatedly performing this embodiment. However, the mechanism of the formation is still unclear and is not fully understood. The empirical findings concerning the projections or depressions on the surface of the InP window layer 5 are summarized below.

Figure 4A:
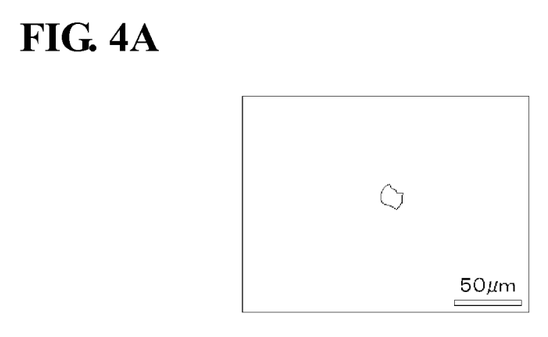
FIG. 4A illustrates projections or depressions formed on a surface of a top layer in the case where the number of pairs of InGaAs/GaAsSb is 50.
Figure 4B:
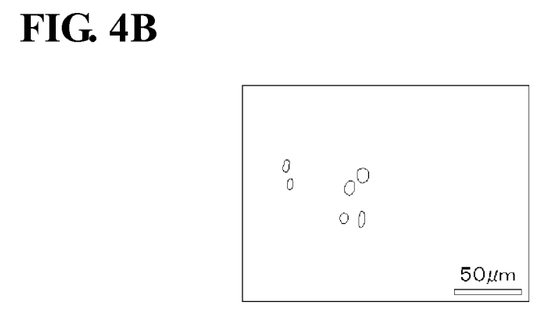
FIG. 4B illustrates projections or depressions formed on a surface of a top layer in the case where the number of pairs of InGaAs/GaAsSb is 150.
Figure 4C:
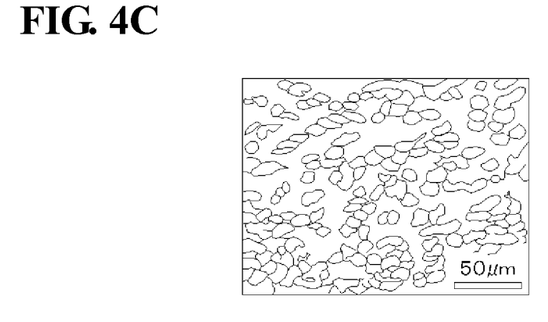
FIG. 4C illustrates projections or depressions formed on a surface of a top layer in the case where the number of pairs of InGaAs/GaAsSb is 250.
Figure 4D:
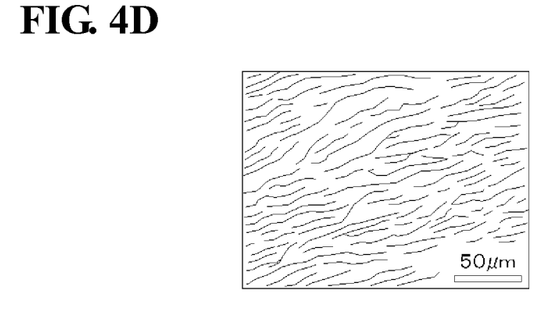
FIG. 4D illustrates projections or depressions formed on a surface of a top layer in the case where the number of pairs of InGaAs/GaAsSb is 350.

(a1) When the number of pairs of the type-II multiple quantum well structure is changed at a constant growth temperature of 500° C., the number density of projections or depressions increases as the number of pairs increases. FIGS. 4A to 4D illustrate the degree of formation of the projections or depressions when the number of pairs of the InGaAs/GaAsSb type-II MQW is increased. The number of pairs is 50 in FIG. 4A, 150 in FIG. 4B, 250 in FIG. 4C, and 350 in FIG. 4D. The number density of the projections or depressions increases as the number of pairs increases, and substantially the entire surface is covered when the number of pairs is 350 in FIG. 4D. In FIG. 4C illustrating about 250 pairs, the number density of the projections or depressions is $10^6$ $cm^{-2}$. In FIG. 4D, an excessive number (excessive number density) of projections or depressions are formed and the dark current considerably increases.

Figure 5A:
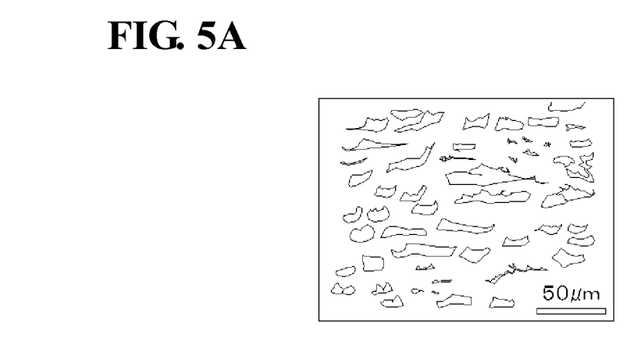
FIG. 5A illustrates projections or depressions formed on a surface of a top layer in the case where 250 pairs of InGaAs/GaAsSb are grown at a growth temperature of 450° C.
Figure 5B:
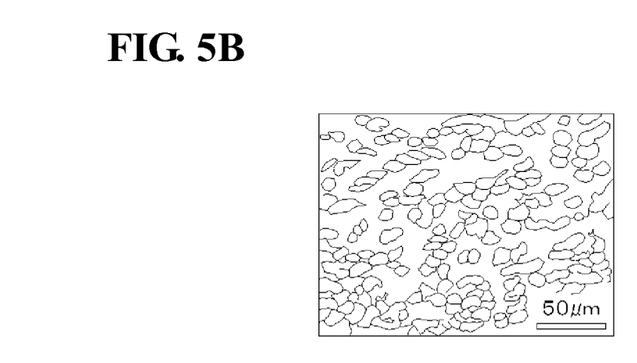
FIG. 5B illustrates projections or depressions formed on a surface of a top layer in the case where 250 pairs of InGaAs/GaAsSb are grown at a growth temperature of 500° C.
Figure 5C:
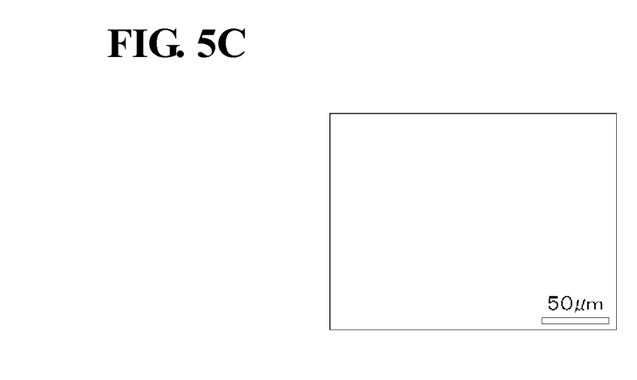
FIG. 5C illustrates projections or depressions formed on a surface of a top layer in the case where 250 pairs of InGaAs/GaAsSb are grown at a growth temperature of 525° C.

(a2) FIGS. 5A to 5C illustrate the influence of the growth temperature of the InGaAs/GaAsSb type-II MQW on the formation of the projections or depressions. The projections or depressions are formed when the growth temperature of the type-II multiple quantum well (MQW) structure 3 is about 500° C. or lower. At a growth temperature of 525° C. illustrated in FIG. 5C, almost no projections or depressions are formed (the number of pairs of MQW: 250). FIG. 5B illustrates a state at a growth temperature of 500° C. and FIG. 5A illustrates a state at a growth temperature of 450° C. When the growth temperature is decreased from about 500° C. and reaches, for example, 450° C. as illustrated in FIG. 5A, the number density (number per unit area) of the projections or depressions decreases. At a growth temperature of 525° C., almost no projections or depressions are formed, but the phase separation of GaAsSb in the MQW occurs, resulting in a considerable increase in dark current.

(a3) If the number of pairs of the type-II MQW 3 is excessively increased, the number density of the projections or depressions exceeds $10^6$ $cm^{-2}$ and the projections or depressions cover the entire surface. The crystallinity of the type-II MQW 3 or the like degrades due to the excessive increase in the number of pairs. Since an increase in the number of pairs of the type-II MQW 3 is a crystallinity-degrading factor, the direct cause of an increase in the dark current of a photodiode with, for example, 300 or more pairs is a degradation of the crystallinity of the MQW itself. It is believed that a form in which the entire surface is densely covered with projections or depressions relates to the degradation of the inside crystallinity.

Figure 6:
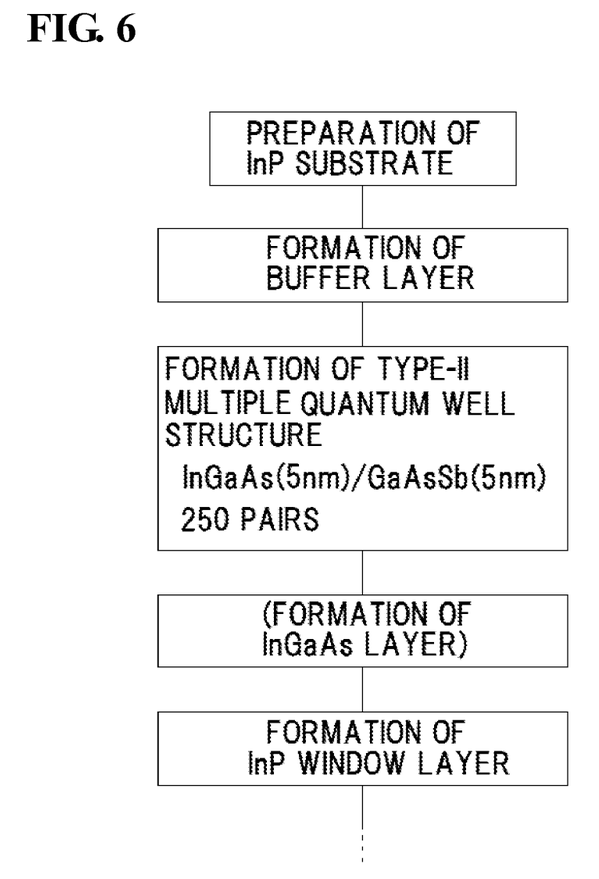
FIG. 6 is a flowchart showing a production method.

A production method will now be described with reference to FIG. 6. MOVPE is preferably employed as the growth method, but any method may be employed as long as such a method is substantially equivalent to the MOVPE. For example, metal-organic vapor phase epitaxy using only metal-organic gases as source gases may be employed. First, an InP substrate 1 having a plane orientation of (100) and an off angle of −0.030° or more and +0.030° or less (which may also be called "a (100) just-angle substrate") is prepared. A typical treatment such as wet etching is performed as a matter of course. An n-type InGaAs buffer layer 2 is epitaxially grown on the InP substrate 1 so as to have a thickness of, for example, about 150 nm. The buffer layer 2 may be an InP buffer layer. Tetraethylsilane (TeESi) is preferably used for n-type doping.

The layers overlying the buffer layer 2 are preferably grown by the MOVPE, which can be performed at a low growth temperature and with high growth efficiency. An InGaAs/GaAsSb type-II MQW 3, an InGaAs diffusive-concentration-distribution-adjusting layer 4, and an InP window layer 5 are continuously grown in the same growth chamber by the MOVPE. At this time, in particular, the growth temperature of the InGaAs/GaAsSb type-II MQW 3 is preferably 400° C. or higher and 500° C. or lower. This is because, although the reason is unclear, at a growth temperature of higher than 500° C., projections or depressions are not formed on a top layer in a preferred manner. Furthermore, although the relationship with projections or depressions is unclear, at a growth temperature of higher than 500° C., the phase separation of GaAsSb occurs as a result of thermal damage on the GaAsSb. The phase separation of GaAsSb considerably decreases the production yield. At a growth temperature of lower than 400° C., the source gases in the MOVPE do not sufficiently decompose and carbon is incorporated into an epitaxial layer. The carbon is derived from hydrocarbons bonded to metals in the source gases. Incorporation of carbon into an epitaxial layer results in formation of an unintended p-type region and the resultant semiconductor elements have poor performance. For example, such photodiodes have a large dark current and cannot be practically used as products. The method for producing an epitaxial wafer has been schematically described so far with reference to FIG. 6. Hereinafter, growth methods of each layer will be described in detail.

As described above, the epitaxial wafer can be produced by typical MOVPE. That is, the above-described semiconductor element or the like can be produced with a commercially available metal-organic vapor phase epitaxy apparatus using typical source gases. However, a semiconductor element having higher crystallinity can be produced by metal-organic vapor phase epitaxy using only metal-organic sources. The metal-organic vapor phase epitaxy using only metal-organic sources is a method that uses only metal-organic gases as deposition materials. The difference between the typical metal-organic vapor phase epitaxy and the metal-organic vapor phase epitaxy using only metal-organic sources is a source material used for forming a III-V semiconductor layer including phosphorus. Tertiarybutyl-phosphine (TBP) is used as the phosphorus source material in the metal-organic vapor phase epitaxy using only metal-organic sources (all metal-organic source MOVPE) whereas phosphine ($PH_3$), which is an inorganic material, is used as the phosphorus source material in the typical MOVPE. However, the difference is not so significant in the production of the epitaxial wafer according to this embodiment.

Figure 7:
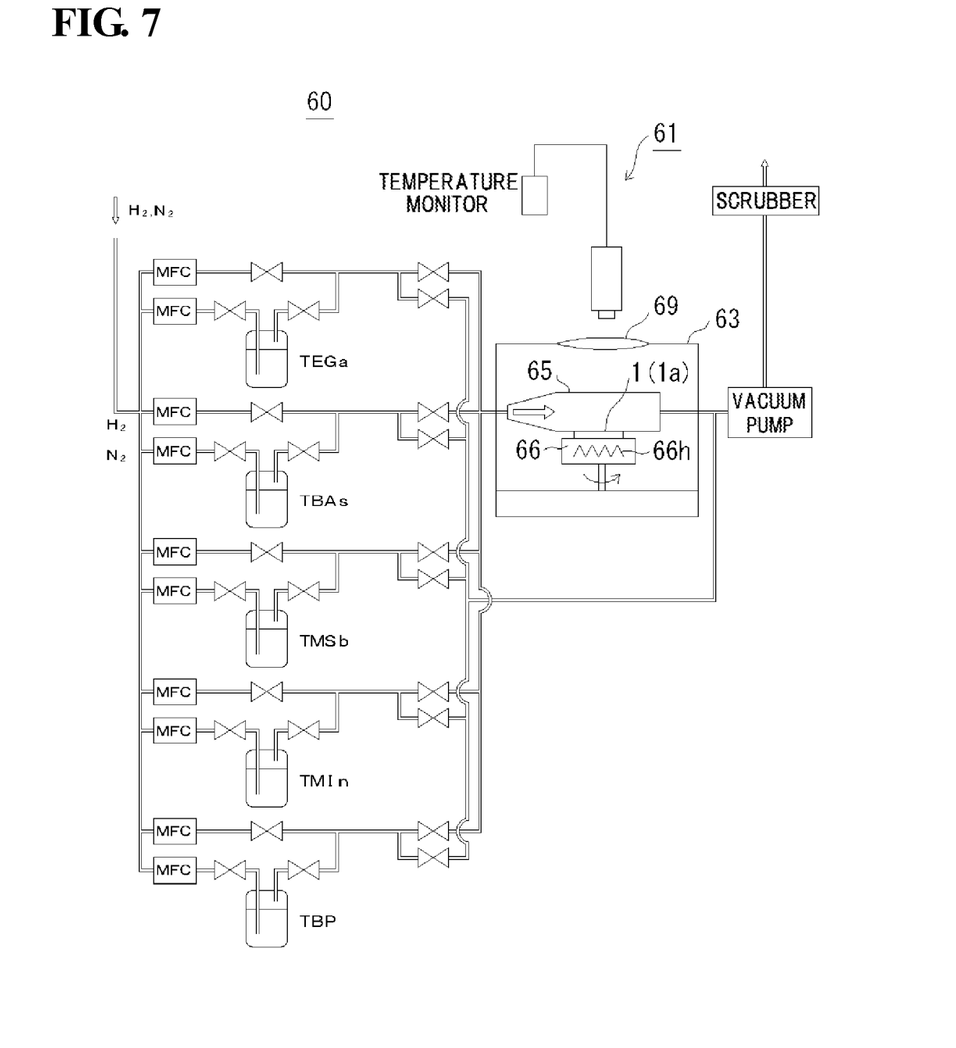
FIG. 7 illustrates a piping system and the like of a deposition apparatus for metal-organic vapor phase epitaxy using only metal-organic sources.

FIG. 7 illustrates a piping system and the like of a deposition apparatus 60 for the metal-organic vapor phase epitaxy using only metal-organic sources. This is a deposition apparatus for the metal-organic vapor phase epitaxy using only metal-organic sources, but substantially the same deposition apparatus is also used for MOVPE. A quartz tube 65 is disposed in a reaction chamber 63. Source gases are introduced into the quartz tube 65. In the quartz tube 65, a substrate table 66 is rotatably and hermetically disposed. The substrate table 66 is equipped with a heater 66h for heating a substrate. The surface temperature of the epitaxial wafer 1a during deposition is monitored with an infrared thermometer 61 through a window 69 disposed in the ceiling portion of the reaction chamber 63. This monitored temperature is referred to as, for example, the growth temperature, the deposition temperature, or the substrate temperature. Regarding formation of an MQW at a temperature of 400° C. or higher and 500° C. or lower in a production method according to the present invention, the temperature of 400° C. or higher and 500° C. or lower is a temperature measured in the temperature monitoring. Forced evacuation of the quartz tube 65 is performed with a vacuum pump.

Source gases are supplied through pipes connected to the quartz tube 65. Although FIG. 7 does not describe source gases of, for example, impurities that govern the conductivity type, impurities are also introduced in the form of metal-organic gases. The metal-organic source gases are contained in constant temperature baths and kept at constant temperatures. The carrier gases used are hydrogen ($H_2$) and nitrogen ($N_2$). The metal-organic gases are carried with the carrier gases and sucked with the vacuum pump to thereby be introduced into the quartz tube 65. The flow rates of the carrier gases are accurately controlled with mass flow controllers (MFCs). A large number of mass flow controllers, electromagnetic valves, and the like are automatically controlled with microcomputers.

After the buffer layer 2 is grown, the absorption layer 3 having a type-II MQW is formed in which the quantum well is constituted by the pair of InGaAs/GaAsSb. In the quantum well, GaAsSb films have a thickness of, for example, 5 nm and InGaAs films have a thickness of, for example, 5 nm. In the deposition of GaAsSb, triethylgallium (TEGa), tertiarybutylarsine (TBAs), and trimethylantimony (TMSb) are used. In the deposition of InGaAs, TEGa, TMIn, and TBAs can be used.

The gallium (Ga) source may be triethylgallium (TEGa) or trimethylgallium (TMGa). The indium (In) source may be trimethylindium (TMIn) or triethylindium (TEIn). The arsenic (As) source may be tertiarybutylarsine (TBAs) or trimethylarsenic (TMAs). The antimony (Sb) source may be trimethylantimony (TMSb), triethylantimony (TESb), triisopropylantimony (TIPSb), or trisdimethylaminoantimony (TDMASb).

The source gases are carried through pipes, introduced into the quartz tube 65, and discharged. Any number of source gases may be supplied to the quartz tube 65 by increasing the number of pipes. For example, even more than ten source gases can be controlled by opening/closing of electromagnetic valves. The flow rates of the source gases are controlled with mass flow controllers (MFCs) illustrated in FIG. 7 and introduction of the source gases into the quartz tube 65 is turned on/off by opening/closing of air-driven valves. The source gases are forcibly evacuated from the quartz tube 65 with the vacuum pump. The source gases do not stagnate anywhere and the flow rates thereof are smoothly automatically controlled. Accordingly, switching between compositions during the formation of the pair constituting the quantum well is quickly achieved.

Figure 8A:
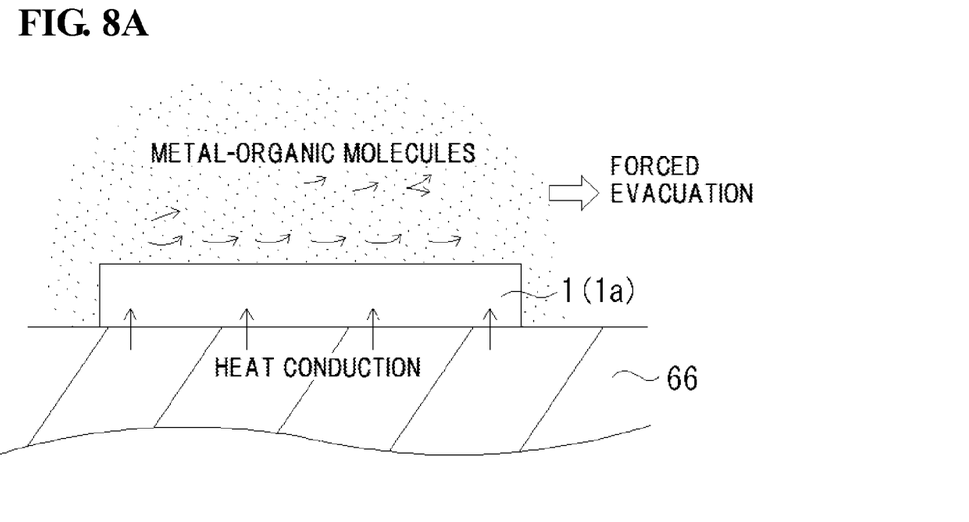
FIG. 8A illustrates flow of metal-organic molecules and thermal flow.
Figure 8B:
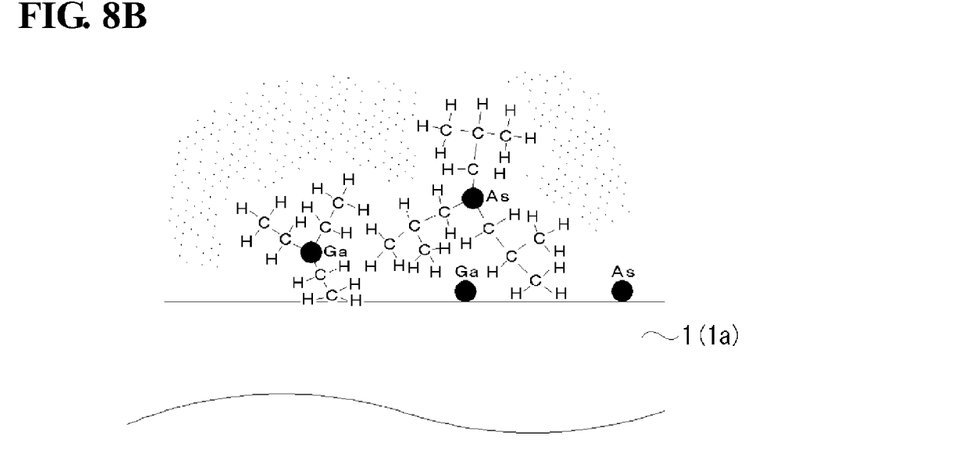
FIG. 8B is a schematic view of metal-organic molecules on a substrate surface.

FIG. 8A illustrates flow of metal-organic molecules and thermal flow. FIG. 8B is a schematic view of metal-organic molecules on a substrate surface. The surface temperature of the epitaxial wafer 1a is monitored. When large metal-organic molecules illustrated in FIG. 8B flow in a portion close to the wafer surface, compound molecules that decompose to contribute to crystal growth are probably limited to metal-organic molecules in contact with the surface and several metal-organic molecules present above the surface. However, when the epitaxial wafer surface temperature or the substrate temperature is an excessively low temperature such as lower than 400° C., large molecules of source gases are not sufficiently decomposed and, in particular, carbon is not sufficiently removed and is incorporated into the epitaxial wafer 1a. The carbon incorporated into III-V semiconductors serves as a p-type impurity and unintended semiconductor elements are formed. Thus, the inherent functions of the semiconductors are degraded, resulting in degradation of the performance of the produced semiconductor elements.

When source gases are selected with air-driven valves so as to correspond to the chemical compositions of the pair and introduced under forcible evacuation with a vacuum pump, after slight growth of a crystal having an old chemical composition due to inertia, a crystal having a new chemical composition can be grown without being influenced by the old source gases. As a result, a sharp composition change can be achieved at the heterointerface. This means that the old source gases do not substantially remain in the quartz tube 65.

When the MQW 3 is formed through growth at a temperature higher than 500° C., the GaAsSb layer of the MQW considerably undergoes phase separation, which decreases the production yield. On the other hand, as described above, when the growth temperature is lower than 400° C., carbon necessarily contained in source gases is incorporated into the epitaxial wafer. The incorporated carbon functions as a p-type impurity. Accordingly, the resultant semiconductor elements have poor performance and cannot be used as products.

It is another point that the growth by the MOVPE or the metal-organic vapor phase epitaxy using only metal-organic sources is continued within the same growth chamber or the same quartz tube 65 from the formation of the MQW to the formation of the InP window layer 5. Specifically, the epitaxial wafer 1a is not taken out of the growth chamber prior to the formation of the InP window layer 5 and the InP window layer 5 is not formed by another deposition method. Thus, regrown interfaces are not formed. Since the InGaAs diffusive-concentration-distribution-adjusting layer 4 and the InP window layer 5 are continuously formed in the quartz tube 65, the interfaces 16 and 17 illustrated in FIGS. 1 and 2 are not regrown interfaces. In regrown interfaces, at least one of an oxygen concentration of $1 \times 10^{17}$ cm$^{-3}$ or more and a carbon concentration of $1 \times 10^{17}$ cm$^{-3}$ or more is satisfied, and the crystallinity becomes poor and the surface of the epitaxial layered body is less likely to become smooth. At the interfaces 16 and 17 of the present invention, both of the oxygen concentration and the carbon concentration are less than $1 \times 10^{17}$ cm$^{-3}$.

In this embodiment, a non-doped InGaAs diffusive-concentration-distribution-adjusting layer 4 having a thickness of, for example, about 1.0 µm is formed on the absorption layer 3 including an MQW. In the formation of photodiodes, diffusion of Zn at high concentration into the MQW results in degradation of the crystallinity as described above. Accordingly, for the purpose of adjusting the diffusive concentration distribution of Zn, the InGaAs diffusive-concentration-distribution-adjusting layer 4 is formed. After the InP window layer 5 is formed, the p-type impurity Zn is selectively diffused by a selective diffusion method from the InP window layer 5 to the InGaAs diffusive-concentration-distribution-adjusting layer 4. Although the InGaAs diffusive-concentration-distribution-adjusting layer 4 is preferably formed as described above, the formation thereof may be omitted. Even when the InGaAs diffusive-concentration-distribution-adjusting layer 4 is inserted and it is a non-doped layer, InGaAs has a narrow bandgap and hence the photodiodes can be made to have a low electric resistance. By decreasing the electric resistance, the responsivity can be enhanced and good element characteristics can be obtained.

It is preferred that, while the epitaxial wafer 1a is left in the same quartz tube 65, the undoped InP window layer 5 be successively epitaxially grown on the InGaAs diffusive-concentration-distribution-adjusting layer 4 by MOVPE or metal-organic vapor phase epitaxy using only metal-organic sources so as to have a thickness of, for example, about 0.8 μm. As described above, the source gases are trimethylindium (TMIn) and tertiarybutylphosphine (TBP). By using these source gases, the growth temperature for the InP window layer 5 can be set to 400° C. or higher and 500° C. or lower. As a result, GaAsSb of the MQW underlying the InP window layer 5 is subjected to no or relatively small thermal damage.

For example, growth of an InP window layer by molecular beam epitaxy (MBE) requires a solid phosphorus source and hence has problems in terms of safety and the like. In addition, the production efficiency needs to be enhanced. In the case where the MQW 3 and the InGaAs diffusive-concentration-distribution-adjusting layer 4 are grown by MBE suitable for the growth of the MQW 3 and subsequently the InP window layer 5 is grown by a method other than MBE in view of safety, the interface 17 between the InGaAs diffusive-concentration-distribution-adjusting layer 4 and the InP window layer 5 is a regrown interface that has been exposed to the air. The regrown interface can be identified when at least one of an oxygen concentration of $1\times10^{17}$ cm$^{-3}$ or more and a carbon concentration of $1\times10^{17}$ cm$^{-3}$ or more is satisfied as a result of measurement by secondary ion mass spectrometry. The regrown interface forms a cross line through p-type regions and leakage current occurs in the cross line, which considerably degrades element characteristics.

EXAMPLES

Figure 9:
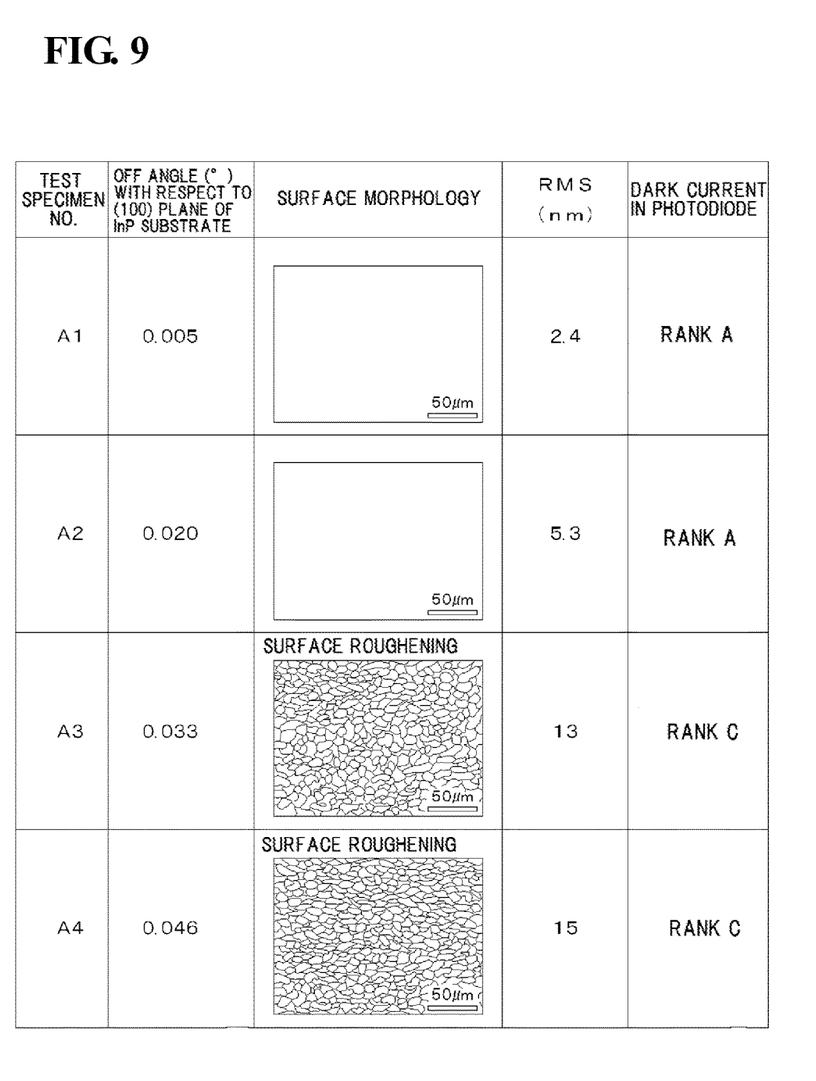
FIG. 9 illustrates the characteristics of each test specimen prepared in Examples.

Regarding the InP substrate, four test specimens A1 to A4 having different off angles with respect to a plane orientation (100) so that RMS values of InP window layers were changed were prepared and the performance of each of the four test specimens A1 to A4 was measured. The growth temperature of an MQW of the four test specimens A1 to A4 was set to be 500° C. In each of the test specimens A1 to A4, the number of pairs of the MQW was set to be 250. The measurement items were as follows: (1) the surface morphology of an epitaxial wafer illustrated in FIG. 1, (2) the RMS value of the InP window layer, and (3) the dark current of a photodiode that used the epitaxial wafer and is illustrated in FIG. 2. Among the four test specimens A1 to A4, the test specimens A1 and A2 correspond to Invention Examples and the test specimens A3 and A4 correspond to Comparative Examples. FIG. 9 illustrates the measurement results. The dark current was measured at a temperature of −50° C. at a voltage of −1 V.

Referring to FIG. 9, the test specimen A2 had an off angle of 0.020°, an RMS value of 5.3 nm, and a dark current with Rank A (5 pA or less). The test specimen A1 had an off angle of 0.005° and an RMS value of 2.4 nm and the surface morphology of the test specimen A1 was at a level illustrated in FIG. 4C in terms of projections or depressions (in FIG. 9, a portion not containing projections or depressions was observed). The dark current of the test specimen A1 was at Rank A (5 pA or less). The test specimens A1 and A2 correspond to Invention Examples and both had good characteristics. In contrast, the test specimens A3 and A4 had large off angles of 0.033° and 0.046°, respectively, and consequently had poor surface morphology in which projections or depressions were densely formed at a level of surface roughening. The RMS values of the test specimens A3 and A4 were 13 nm and 15 nm, respectively. As a result of formation of projections or depressions at a level of surface roughening, the dark current was poor and at Rank C (1000 pA to 3000 pA). The characteristics (dark current) of the test specimens A3 and A4 corresponding to Comparative Examples were obviously poor compared with the characteristics of the test specimens A1 and A2 corresponding to Invention Examples.

According to the present invention, good crystallinity can be achieved by controlling the off angle with respect to a plane orientation of a substrate, the growth temperature of a multiple quantum well structure, and the like. Consequently, surface roughening and the like in the surface morphology are prevented, which, for example, can decrease the dark current in a photodiode.

What is claimed is:

1. An epitaxial wafer comprising:
   a substrate composed of a III-V compound semiconductor;
   a multiple quantum well structure composed of a III-V compound semiconductor and located on the substrate; and
   a top layer composed of a III-V compound semiconductor and located on the multiple quantum well structure,
   wherein the substrate has a plane orientation of (100) and an off angle of −0.030° or more and +0.030° or less,
   a surface of the top layer has a root-mean-square roughness of less than 10 nm, and
   wherein projections or depressions are present on the surface of the top layer at a number density of 100/cm$^2$ or more and $1\times10^6$/cm$^2$ or less.

2. The epitaxial wafer according to claim 1, wherein the multiple quantum well structure is a type-II multiple quantum well structure constituted by pairs of In$_x$Ga$_{1-x}$As (0.38≤x≤0.68) and GaAs$_{1-y}$Sb$_y$ (0.36≤y≤0.62) or pairs of Ga$_{1-u}$In$_u$N$_v$As$_{1-v}$(0.4≤u≤0.8, 0<v<0.2) and GaAs$_{1-y}$Sb$_y$ (0.36≤y≤0.62).

3. The epitaxial wafer according to claim 1, wherein the top layer composed of a III-V compound semiconductor is an InP layer.

4. A semiconductor element comprising the substrate, the multiple quantum well structure, and the top layer that are included in the epitaxial wafer according to claim 1.

5. The semiconductor element according to claim 4, wherein the multiple quantum well structure is an absorption layer and the semiconductor element is used as a photodiode.

6. An optical sensor device comprising the semiconductor element according to claim 5 and a readout circuit.

7. A method for producing an epitaxial wafer formed using a substrate composed of a III-V compound semiconductor, the method comprising:
   a step of growing a multiple quantum well structure composed of a III-V compound semiconductor on the substrate; and
   a step of forming a top layer composed of a III-V compound semiconductor on the multiple quantum well structure,
   wherein the substrate has a plane orientation of (100) and an off angle of −0.030° or more and +0.030° or less,
   in the step of growing a multiple quantum well structure, the multiple quantum well structure is grown at a growth temperature of 400° C. or higher and 500° C. or lower by metal-organic vapor phase epitaxy, and projections or depressions are formed on a surface of the top layer at a number density of 100/$cm_2$ or more and $1 \times 10^6$/$cm_2$ or less, and the surface of the top layer has a root-mean-square roughness of less than 10 nm.

8. The epitaxial wafer according to claim 1, wherein the multiple quantum well structure is constituted by pairs of a III-V compound semiconductor layer including In, Ga and As, and a III-V compound semiconductor layer including Sb.

9. The epitaxial wafer according to claim 8, wherein a number of pairs in the multiple quantum well structure is 25 or more.

10. The epitaxial wafer according to claim 1, wherein the top layer is formed of a III-V compound semiconductor having a bandgap energy larger than a bandgap energy of an absorption layer including the multiple quantum well structure.

11. The epitaxial wafer according to claim 1, further comprising a diffusive-concentration-distribution-adjusting layer located between the multiple quantum well structure and the top layer.

* * * * *

UNITED STATES PATENT AND TRADEMARK OFFICE
CERTIFICATE OF CORRECTION

PATENT NO.        : 9,698,287 B2  
APPLICATION NO.   : 14/260110  
DATED             : July 4, 2017  
INVENTOR(S)       : Fujii et al.

Page 1 of 1

It is certified that error appears in the above-identified patent and that said Letters Patent is hereby corrected as shown below:

In the Claims

Column 14, Claim 2, Line 5, replace "..., $0<v<0.2$)" with "..., $0<v\leq0.2$)".

Column 15, Claim 7, Line 4, replace ".../cm$_2$" with ".../cm$^2$".

Column 15, Claim 7, Line 5, replace ".../cm$_2$" with ".../cm$^2$".

Signed and Sealed this  
Twelfth Day of September, 2017

Joseph Matal  
*Performing the Functions and Duties of the*  
*Under Secretary of Commerce for Intellectual Property and*  
*Director of the United States Patent and Trademark Office*